US012568710B1

(12) United States Patent
Xu et al.

(10) Patent No.: US 12,568,710 B1
(45) Date of Patent: Mar. 3, 2026

(54) SILICON CARBIDE DETECTOR AND FABRICATION METHOD THEREOF

(71) Applicants: NANJING UNIVERSITY, Nanjing (CN); Hefei National Laboratory, Hefei (CN)

(72) Inventors: Weizong Xu, Nanjing (CN); Yue Guo, Nanjing (CN); Hai Lu, Nanjing (CN); Renjie Xu, Nanjing (CN); Dong Zhou, Nanjing (CN); Fangfang Ren, Nanjing (CN); Feng Zhou, Nanjing (CN)

(73) Assignees: NANJING UNIVERSITY, Nanjing (CN); Hefei National Laboratory, Hefei (CN)

( * ) Notice: Subject to any disclaimer, the term of this patent is extended or adjusted under 35 U.S.C. 154(b) by 0 days.

(21) Appl. No.: 19/218,716

(22) Filed: May 27, 2025

(30) Foreign Application Priority Data

Dec. 26, 2024 (CN) .......................... 202411937687.1

(51) Int. Cl.
*H10F 77/1226* (2025.01)
*H10F 71/00* (2025.01)
*H10F 77/20* (2025.01)
*H10F 30/29* (2025.01)

(52) U.S. Cl.
CPC ..... *H10F 77/1227* (2025.01); *H10F 71/1215* (2025.01); *H10F 77/241* (2025.01); *H10F 30/29* (2025.01)

(58) Field of Classification Search
CPC .... H10F 77/1227; H10F 77/241; H10F 30/29; H10F 71/1215
See application file for complete search history.

(56) References Cited

FOREIGN PATENT DOCUMENTS

CN        115172457 A    * 10/2022    ......... H10D 30/6704

OTHER PUBLICATIONS

Improved machine translation of CN-115172457-A, published 2022.*

* cited by examiner

*Primary Examiner* — Suberr L Chi
(74) *Attorney, Agent, or Firm* — Bayramoglu Law Offices LLC

(57)        ABSTRACT

Provided are a silicon carbide detector and a fabrication method thereof. The silicon carbide detector includes: a silicon carbide substrate layer; and a silicon carbide base layer located on a side of the silicon carbide substrate layer, where the silicon carbide base layer includes a first silicon carbide layer, a second silicon carbide layer and a third silicon carbide layer that are stacked; the third silicon carbide layer serves as an anode layer and is located in a first region of the second silicon carbide layer, and a second region of the second silicon carbide layer is exposed; N drift rings are provided in the second region of the second silicon carbide layer, and among the N drift rings, a 1st drift ring is a closed ring and remaining drift rings are arranged in a spiral pattern around the 1st drift ring.

8 Claims, 6 Drawing Sheets

SILICON CARBIDE DETECTOR AND FABRICATION METHOD THEREOF

CROSS REFERENCE TO THE RELATED APPLICATIONS

This application is based upon and claims priority to Chinese Patent Application No. 202411937687.1, filed on Dec. 26, 2024, the entire contents of which are incorporated herein by reference.

TECHNICAL FIELD

The present disclosure relates to the technical field of semiconductors, and in particular relates to a silicon carbide detector and a fabrication method thereof.

BACKGROUND

A silicon drift detector (SDD) is a high-performance X-ray detector that was originally developed for high-energy physical applications. Nowadays, fabrication technologies thereof have become relatively mature and commercially available. A spiral silicon drift detector has low cost and low process complexity compared with other types of detectors. During operation, the spiral silicon drift detector is capable of forming a distinct electron channel in a silicon substrate, and thus, exhibiting excellent performance in terms of operational sensitivity, frequency response speed and collection efficiency. However, the silicon drift detector has a leakage current on the order of $10^{-9}$ at operating voltage, thereby requiring an external cooling plate to reduce operating current leakage and improve device performance. This not only increases the complexity of packaging a structure including the silicon drift detector, but also inevitably increases the overall power consumption of the structure including the silicon drift detector.

Silicon carbide (4H-SiC) is an outstanding representative of third-generation semiconductor materials with high critical breakdown voltage, high saturation drift velocity and high thermal conductivity. As a result, detectors fabricated from the SiC exhibit extremely low dark current and significantly higher operating temperatures. This allows the design and fabrication of a high-performance silicon carbide-based non-refrigerated drift chamber detector a topic of significant research interest.

SUMMARY

In view of the above problems, the present disclosure provides a silicon carbide detector and a fabrication method thereof, to design and fabricate a high-performance silicon carbide-based non-refrigerated drift chamber detector. The specific solutions are as follows.

A silicon carbide detector, including:
  a silicon carbide substrate layer having a first doping type; and
  a silicon carbide base layer located on a side of the silicon carbide substrate layer, the silicon carbide base layer including a first silicon carbide layer, a second silicon carbide layer and a third silicon carbide layer that are stacked, the first silicon carbide layer having a second doping type, and the third silicon carbide layer having the first doping type;
  where the third silicon carbide layer serves as an anode layer and is located in a first region of the second silicon carbide layer, and a second region of the second silicon carbide layer is exposed; N drift rings are provided in the second region of the second silicon carbide layer, and among the N drift rings, a 1st drift ring is a closed ring and remaining drift rings are arranged in a spiral pattern around the 1st drift ring, a leading end of an (i+1)th drift ring being connected to a trailing end of an ith drift ring, N being an integer greater than 1, and i being, in turn, any integer from 1 to N−1; and in a plane parallel to a plane in which the silicon carbide substrate layer lies, the anode layer is located in a closed region of the 1st drift ring; and the N drift rings each have the second doping type.

In some embodiments, the second region includes a first subregion and a second subregion, a detection photosensitivity of the second subregion being greater than a detection photosensitivity of the first subregion; among the N drift rings, except for the 1st drift ring, at least one of the remaining drift rings includes a first component located in the first subregion and a second component located in the second subregion; and
  the second component includes M subcomponents connected in parallel, the M subcomponents being parallel to each other, and M being an integer in a range of not less than 2.

In some embodiments, the M is in the range of 2 to 4.

In some embodiments, when the N is greater than 2, among the N drift rings, except for the 1st drift ring and a 2nd drift ring, each of other drift rings includes the first component located in the first subregion and the second component located in the second subregion; and the second component includes the M subcomponents connected in parallel.

In some embodiments, among the N drift rings, except for the 1st drift ring and the 2nd drift ring, the other drift rings include a first drift ring and a second drift ring, a distance from the first drift ring to the 1st drift ring being less than a distance from the second drift ring to the 1st drift ring, and a number of subcomponents contained in the second component of the first drift ring being less than a number of subcomponents contained in the second component of the second drift ring.

In some embodiments, the second region of the second silicon carbide layer are further provided with guard rings, the guard rings being closed rings, and the N drift rings being located within a closed region of the guard rings.

In some embodiments, the first doping type is N-type, the second doping type is N-type, and doping ions in each of the N drift rings are selected from the group consisting of aluminum ions and boron ions; and
  a doping concentration in the second silicon carbide layer ranges from $1\times10^{12}$ cm$^{-3}$ to $1\times10^{19}$ cm$^{-3}$.

In some embodiments, a width of a gap between adjacent drift rings in the N drift rings ranges from 5 μm to 500 μm.

A method for fabrication of a silicon carbide detector, including:
  forming a silicon carbide base layer on a silicon carbide substrate layer, where the silicon carbide substrate layer has a first doping type, the silicon carbide base layer includes a first silicon carbide layer, a second silicon carbide layer and a third silicon carbide layer that are stacked, the first silicon carbide layer having a second doping type, and the third silicon carbide layer having the first doping type;
  removing a portion of the third silicon carbide layer located in a second region of the second silicon carbide layer and retaining a portion of the third silicon carbide layer located in a first region of the second silicon carbide layer to form an anode layer;

performing ion implantation in the second region of the second silicon carbide layer to form N drift rings in the second region of the second silicon carbide layer, where among the N drift rings, a 1st drift ring is a closed ring and remaining drift rings are arranged in a spiral pattern around the 1st drift ring, a leading end of an (i+1)th drift ring being connected to a trailing end of an ith drift ring, N being an integer greater than 1, i being, in turn, any integer from 1 to N−1; in a plane parallel to a plane in which the silicon carbide substrate layer lies, the anode layer is located in a closed region of the 1st drift ring; and the second silicon carbide layer has the first doping type and the N drift rings each have the second doping type.

In some embodiments, the performing the ion implantation in the second region of the second silicon carbide layer to form the N drift rings in the second region of the second silicon carbide layer includes:

forming a first mask layer on a side of the silicon carbide base layer facing away from the silicon carbide substrate layer, where the first mask layer has a plurality of openings exposing regions of the second silicon carbide layer where the N drift rings are to be formed;

forming a protective layer covering the silicon carbide base layer and the first mask layer on a side of the first mask layer facing away from the silicon carbide base layer, where the protective layer covers the plurality of the openings;

performing the ion implantation in the second silicon carbide layer using the first mask layer as a mask to form the N drift rings in the second region of the second silicon carbide layer; and removing the first mask layer and the protective layer.

In some embodiments, the method further includes:

performing an oxidation process on an exposed surface of the second silicon carbide layer on a side facing away from the silicon carbide substrate layer and on a surface of the anode layer on a side facing away from the silicon carbide substrate layer to form a first oxide layer, and removing the first oxide layer; and performing the oxidation process at least one time on the exposed surface of the second silicon carbide layer on the side facing away from the silicon carbide substrate layer and on the surface of the anode layer on the side facing away from the silicon carbide substrate layer to form a second oxide layer, and removing the second oxide layer.

By virtue of the above technical solutions, a silicon carbide detector provided by the present disclosure could utilize a spiral arrangement of remaining drift rings among N drift rings, except for a 1st drift ring as a closed ring, to automatically form a uniform lateral voltage gradient. This ensures the uniform distribution of electrons in a drift channel within a silicon carbide material and facilitates the formation of a stable lateral drift electric field within a silicon carbide base layer. Compared with conventional silicon-based drift chamber detectors, the silicon carbide detector provided in some embodiments of the present disclosure could more easily result in high-performance devices with extremely low leakage current, eliminating need for a voltage divider, thereby significantly reducing process complexity and costs.

BRIEF DESCRIPTION OF THE DRAWINGS

The foregoing and other features, advantages and aspects of embodiments of the present disclosure will become more apparent in conjunction with drawings and by reference to the following specific embodiments. Throughout the drawings, identical or similar reference signs refer to identical or similar elements. It should be understood that the drawings are schematic and originals and the elements are not necessarily drawn to scale.

REFERENCE SIGNS

10—silicon carbide substrate layer; 20—silicon carbide base layer; 21—first silicon carbide layer; 22—second silicon carbide layer; 23—third silicon carbide layer; 30—drift ring; 31—1st drift ring; 3N—Nth drift ring; 301—first component; 3011—first branch; 3012—second branch; 302—second component; 40—guard ring; 50—passivation layer; 61—first metal contact layer; 62—second metal contact layer; 63—third metal contact layer; 64—fourth metal contact layer; 70—first mask layer; 80—protective layer.

DETAILED DESCRIPTION OF THE EMBODIMENTS

The technical solutions of the embodiments of the present disclosure will be clearly and completely described below with reference to the drawings in the embodiments of the present disclosure. Apparently, the described embodiments are merely a part rather than all of the embodiments of the present disclosure. Based on the embodiments of the present disclosure, all remaining embodiments that would have been obtained by those of ordinary skill in the art without any creative efforts shall fall within the scope of the present disclosure.

Various modifications and variations could be made in the present disclosure without departing from spirit or scope of the present disclosure, which would be apparent to those skilled in the art. Accordingly, the present disclosure is intended to cover modifications and variations that fall within a scope of corresponding claims (claimed technical solutions) and their equivalents. It should be noted that implementations provided in the embodiments of the present disclosure may be combined with each remaining without contradiction.

To make above objects, features, and advantages of the present disclosure more apparent and comprehensible, the present disclosure will be further described in detail below with reference to the drawings and specific embodiments.

As described in the background, design and fabrication of a high-performance silicon carbide-based non-refrigerated drift chamber detector is of significant research interest.

In view of this, the embodiments of the present disclosure provide a silicon carbide detector and a fabrication method thereof, to provide a high-performance silicon carbide-based non-refrigerated drift chamber detector. It should be noted that the silicon carbide-based non-refrigerated drift chamber detector is a high-performance semiconductor detector using silicon carbide (SiC) as a main material. Such detectors could be used for high-energy particle detection, X-ray and gamma-ray detection, as well as space exploration in extreme environments.

Figures 1, 2:
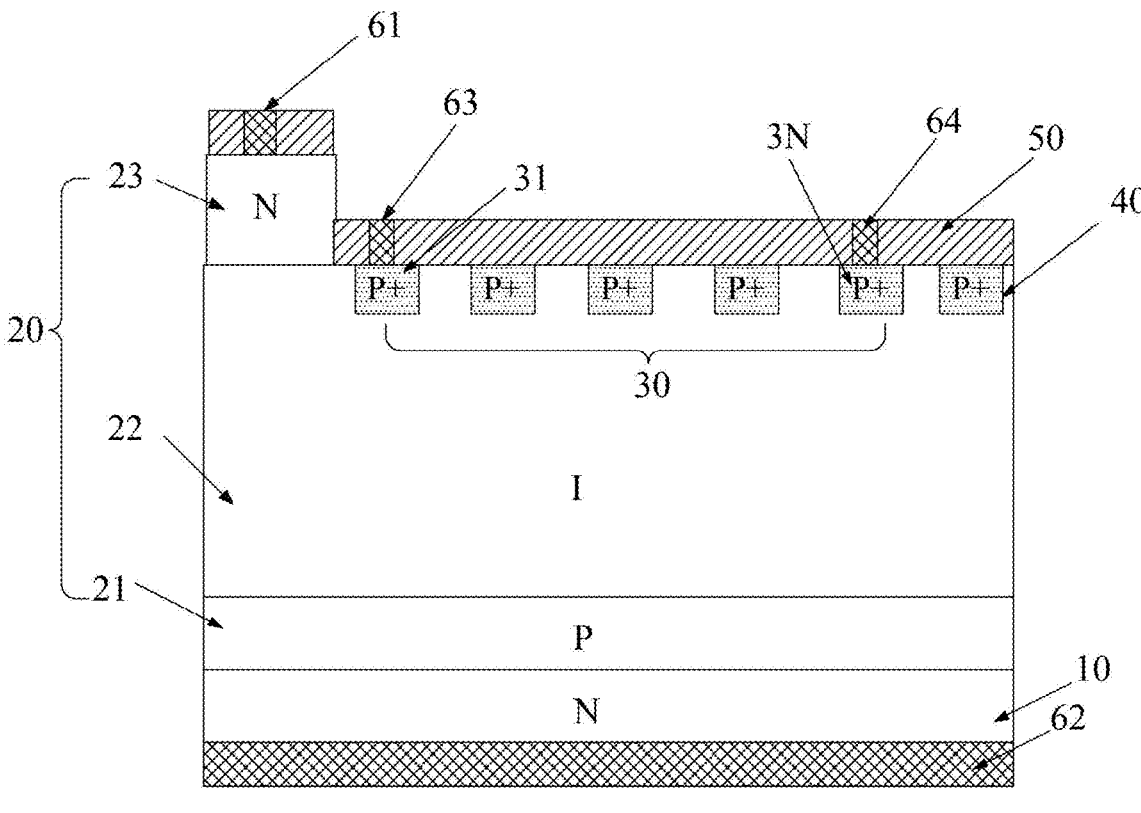
FIG. 1 shows a sectional view of the silicon carbide detector provided in an embodiment of the present disclosure.
FIG. 2 shows a structural schematic view of the silicon carbide detector provided in an embodiment of the present disclosure.
Figure 3:
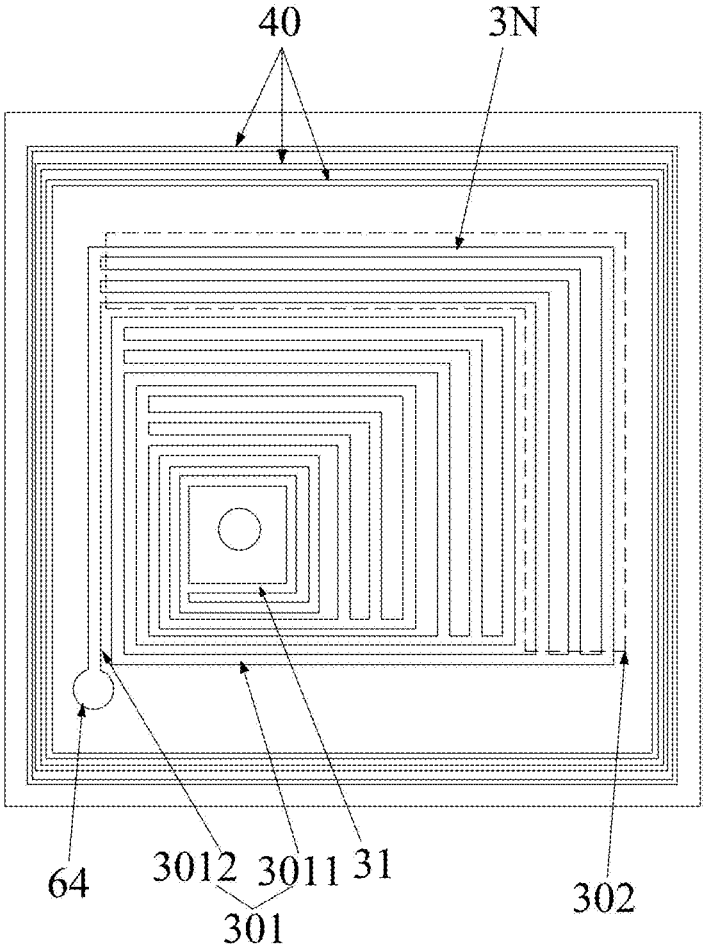
FIG. 3 shows a top view of the silicon carbide detector provided in an embodiment of the present disclosure.

As shown in FIG. 1 to FIG. 3, the silicon carbide detector provided by an embodiment of the present disclosure includes:

a silicon carbide substrate layer 10, the silicon carbide substrate layer 10 having a first doping type, the silicon carbide substrate layer 10 being a conductive layer; and a silicon carbide base layer 20 located on a side of the silicon carbide substrate layer 10, the silicon carbide base layer 20 including a first silicon carbide layer 21, a second silicon carbide layer 22 and a third silicon carbide layer 23 that are stacked, the first silicon carbide layer 21 having a second doping type, and the third silicon carbide layer 23 having the first doping type;

where the third silicon carbide layer 23 serves as an anode layer and is located in a first region of the second silicon carbide layer 22, and a second region of the second silicon carbide layer 22 is exposed; N drift rings 30 are provided in the second region of the second silicon carbide layer 22, and among the N drift rings 30, a 1st drift ring 31 is a closed ring and remaining drift rings are arranged in a spiral pattern around the 1st drift ring 31, a leading end of an (i+1)th drift ring being connected to a trailing end of an ith drift ring, N being an integer greater than 1, and i being, in turn, any integer from 1 to N−1; and in a plane parallel to a plane in which the silicon carbide substrate layer 10 lies, the anode layer is located in a closed region of the 1st drift ring 31; and the N drift rings 30 each have the second doping type.

Optionally, in an embodiment of the present disclosure, as further shown in FIG. 1, the drift rings 30 extend from a surface of the second silicon carbide layer 22 on a side facing away from the silicon carbide substrate layer 10 toward a side of the silicon carbide substrate layer 10, and a depth of the drift rings 30 may range from two hundred nanometers to three hundred nanometers. However, the present disclosure is not limited thereto and is subject to variations depending on specific circumstances.

It should be noted that, in the present embodiment, among the N drift rings, the 1st drift ring is the closed ring, the remaining drift rings are arranged in a spiral pattern around the 1 st drift ring, that is, among the N drift rings, except for the 1st drift ring, and the remaining drift rings extend outward in a spiral manner around the 1st drift ring to form a spiral arrangement.

Specifically, in an embodiment of the present disclosure, as shown in FIG. 3, a projection of each drift ring 30 on the silicon carbide substrate layer is rectangular, i.e., among the N drift rings, except for the 1st drift ring, the remaining drift rings are arranged in a square spiral ring pattern around the 1st drift ring. In another embodiment of the present disclosure, a projection of each drift ring on the silicon carbide substrate layer is circular, i.e. among the N drift rings, except for the 1st drift ring, the remaining drift rings are arranged in a circular spiral ring pattern around the 1st drift ring. In yet another embodiment of the present disclosure, a projection of each drift ring on the silicon carbide substrate layer is elliptical, i.e., among the N drift rings, except for the 1st drift ring, the remaining drift rings are arranged in an elliptical spiral ring pattern around the 1st drift ring. In other embodiments of the present disclosure, among the N drift rings, except for the 1st drift ring, the remaining drift rings are arranged around the 1st drift ring in a spiral ring pattern of another shape. The present disclosure is not limited thereto and is subject to variations depending on specific circumstances.

The silicon carbide detector provided in some embodiments of the present disclosure is described below by taking as an example the projection of each drift ring on the silicon carbide substrate layer being rectangular, i.e., among the N drift rings, except for the 1st drift ring, the remaining drift rings being arranged in the square spiral ring pattern around the 1st drift ring.

It should be noted that in the present embodiment, as shown in FIG. 2 and FIG. 3, among the N drift rings 30, the 1st drift ring 31 is the closed ring for providing a first voltage signal in each direction in a plane parallel to a plane in which the silicon carbide substrate layer lies. In the present embodiment, a second voltage signal is applied to an Nth drift ring 3N, i.e., an outermost drift ring, among the N drift rings 30. As a result, a uniform lateral voltage gradient is automatically formed between the 1st drift ring 31 and the Nth drift ring 3N, by means of the spiral arrangement of the remaining drift rings among N drift rings, except for the 1st drift ring 31. This ensures the uniform distribution of electrons in a drift channel within a silicon carbide material and facilitates the formation of a stable lateral drift electric field within a silicon carbide base layer. Compared with conventional silicon-based drift chamber detectors, the silicon carbide detector provided in the present embodiment eliminates need for a voltage divider, thereby significantly reducing process complexity and costs. Furthermore, by benefiting from superior material properties of the silicon carbide, resulting in high-performance devices with extremely low leakage current becomes easier.

It should be noted that in the present embodiment, the silicon carbide substrate layer is the conductive layer, a PN junction is formed between the silicon carbide substrate layer and the first silicon carbide layer. This configuration could reduce a leakage current on a surface of a side of the silicon carbide substrate layer facing away from the first silicon carbide layer during operation of the silicon carbide detector, thereby reducing the leakage current of the silicon carbide detector.

Optionally, in an embodiment of the present disclosure, the second silicon carbide layer is an intrinsic layer, or may have the first doping type. When the second silicon carbide layer has the first doping type, a doping concentration of the second silicon carbide layer ranges from $1\times10^{12}$ cm$^{-3}$ to $1\times10^{19}$ cm$^{-3}$, and a thickness of the second silicon carbide layer ranges from 20 μm to 50 μm. For example, the doping concentration of the second silicon carbide layer is $2\times10^{13}$ cm$^{-3}$, and the thickness of the second silicon carbide layer is 40 μm. The present disclosure is not limited thereto and is subject to variations depending on specific circumstances. It should also be noted that in the present embodiment, the lower the doping concentration of the second silicon carbide layer, the lower a voltage required to deplete the silicon carbide detector. This allows the silicon carbide detector to reach a depletion state with a minimum voltage during performance testing, thereby reducing power consumption.

Since there is currently no P-type silicon carbide substrate due to process constraints, in an embodiment of the present disclosure, the first doping type is N-type, and the second doping type is P-type. That is, the silicon carbide substrate layer is an N-type silicon carbide substrate, and in the silicon carbide base layer, the first silicon carbide layer is a P-type silicon carbide layer, the third silicon carbide layer is an N-type silicon carbide layer, and the drift rings are P-type doped drift rings.

Taking the first doping type as the N-type and the second doping type as the P-type as an example, the silicon carbide detector provided in some embodiments of the present disclosure is described below.

Optionally, in an embodiment of the present disclosure, the first silicon carbide layer is a P-type doped silicon carbide layer with a doping concentration ranging from $1\times10^{16}$ cm$^{-3}$ to $1\times10^{19}$ cm$^{-3}$ and a thickness ranging from 1 μm to 5 μm. For example, the first silicon carbide layer may have the doping concentration of $1\times10^{16}$ cm$^{-3}$ and the thickness of 2 μm; the third silicon carbide layer is an N-type doped silicon carbide layer with a doping concentration ranging from $1\times10^{18}$ cm$^{-3}$ to $3\times10^{20}$ cm$^{-3}$ and a thickness ranging from 0.1 μm to 5 μm. For example, the third silicon carbide layer may have the doping concentration of $1\times10^{18}$ cm$^{-3}$. However, the present disclosure is not limited thereto and is subject to variations depending on specific circumstances.

It should be noted that in the present embodiment, among the N drift rings, except for the 1st drift ring, the remaining drift rings are arranged in the spiral pattern around the 1st drift ring, the leading end of the (i+1)th drift ring is connected to the trailing end of the ith drift ring. Thus, along a direction away from the 1st drift ring, the greater a length of a conductive path of each of the remaining drift rings among the N drift rings except for the 1st drift ring, the greater a resistance along the conductive path, given the same width of the conductive path.

Optionally, in an embodiment of the present disclosure, the second region includes a first subregion and a second subregion, a detection photosensitivity of the second subregion being greater than a detection photosensitivity of the first subregion; as further shown in FIG. 3, among the N drift rings 30, except for the 1st drift ring 31, at least one of the remaining drift rings includes a first component 301 located in the first subregion and a second component 302 located in the second subregion; and the second component 302 includes M subcomponents connected in parallel to reduce a overall resistance of the second component 302. The M subcomponents are parallel to each other, and M is an integer in a range of not less than 2.

It should be noted that in some uses, a primary detection region of the silicon carbide detector is only a partial region, for example, the second subregion of the silicon carbide detector is a high-photosensitivity region thereof. Therefore, in some embodiments of the present disclosure, only the second component 302 located in the second subregion needs to be configured to include the M subcomponents connected in parallel (i.e., M signal transmission paths connected in parallel), the first component 301 may have only one signal transmission path. However, the present disclosure is not limited thereto and is subject to variations depending on specific circumstances.

Optionally, in an embodiment of the present disclosure, the M is in the range of 2 to 4, i.e., the M is 2, 3 or 4. However, the present disclosure is not limited thereto and is subject to variations depending on specific circumstances.

In some uses, lengths of conductive paths of the 1st drift ring and a 2nd drift ring among the N drift rings are generally small, i.e. the resistance of the 1st drift ring and the 2nd drift ring among the N drift rings is relatively small. Therefore, in an embodiment of the present disclosure, when the N is greater than 2, among the N drift rings, except for the 1st drift ring and the 2nd drift ring, each of other drift rings includes the first component located in the first subregion and the second component located in the second subregion; and the second component includes the M subcomponents connected in parallel to reduce resistance of the remaining drift rings among the N drift rings except for the 1st drift ring and the 2nd drift ring.

It should be noted that along the direction away from the 1st drift ring, the greater the length of the conductive path of each of the remaining drift rings among the N drift rings except for the 1st drift ring, the greater the resistance along the conductive path, given the same width of the conductive path. Thus, in an embodiment of the present disclosure, along the direction away from the 1st drift ring, a number of subcomponents included in the second component of each of the other drift rings among the N drift rings except for the 1st drift ring and the 2nd drift ring gradually increases. For example, the other drift rings among the N drift rings except for the 1st drift ring and the 2nd drift ring include a first drift ring and a second drift ring, a distance from the first drift ring to the 1st drift ring being less than a distance from the second drift ring to the 1st drift ring, and a number of subcomponents included in the second component of the first drift ring being less than a number of subcomponents included in the second component of the second drift ring. However, the present disclosure is not limited thereto. In other embodiments of the present disclosure, along the direction away from the 1st drift ring, the number of the subcomponents included in the second component of each of the other drift rings among the N drift rings except for the 1st drift ring and the 2nd drift ring is partially the same and partially different. As long as the other drift rings among the N drift rings except for the 1st drift ring and the 2nd drift ring include at least one the first drift ring and at least one the second drift ring, the distance from the first drift ring to the 1st drift ring is less than the distance from the second drift ring to the 1st drift ring, and the number of the subcomponents included in the second component of the first drift ring is less than the number of the subcomponents included in the second component of the second drift ring.

Based on any of the above embodiments, in an embodiment of the present disclosure, as further shown in FIG. 1 to FIG. 3, the second region of the second silicon carbide layer 22 are further provided with guard rings 40, the guard rings 40 being closed rings, and the N drift rings 30 being located within a closed region of the guard rings 40. It should be noted that in the present embodiment, the guard rings 40 and the drift rings 30 are of the same doping type. In some embodiments, the guard rings 40 are formed simultaneously with the drift rings 30.

Optionally, in an embodiment of the present disclosure, when the drift rings are the P-type doped drift rings, doping ions in each of the N drift rings are aluminum ions and also are other P-type doping ions such as boron ions; similarly, the doping ions of the guard rings are the aluminum ions, as well as the other P-type doping ions such as the boron ions. The present disclosure is not limited thereto and is subject to variations depending on specific circumstances.

Based on any of the above embodiments, in an embodiment of the present disclosure, a width of a gap between adjacent drift rings in the N drift rings ranges from 5 μm to 500 μm, such as 10 μm. In some embodiments, in each drift ring among the N drift rings that includes the first component and the second component, a distance between adjacent subcomponents in the second component also ranges from 5 μm to 500 μm, such as 10 μm. However, the present disclosure is not limited thereto and is subject to variations depending on specific circumstances.

Optionally, in an embodiment of the present disclosure, among the N drift rings, each of the drift rings that do not include the subcomponents has a width on a surface of the second silicon carbide layer ranging from 5 μm to 300 μm, and the width may further range from 10 μm to 50 μm, for example, 50 μm; among drift rings including the subcomponents, a width of the first component and each of the subcomponent of each of the drift rings on the surface of the second silicon carbide layer ranges from 5 μm to 300 μm, and may further range from 10 μm to 50 μm, for example, 50 μm, in order to prevent a width of the same conductive path from being excessively large, which would hinder carrier migration, and also prevent the width of the same conductive path from being excessively small, which would increase process complexity and make implementation infeasible.

Based on any of the above embodiments, in an embodiment of the present disclosure, as further shown in FIG. 1 to FIG. 3, the silicon carbide detector further includes: a metal contact layer, including:

a first metal contact layer 61 covering the anode layer and electrically connected to the anode layer, the first metal contact layer 61 being an anode metal contact layer;

a second metal contact layer 62 covering the silicon carbide substrate layer 10 from a side of the silicon carbide substrate layer 10 facing away from the silicon carbide base layer 20, the second metal contact layer 62 being a cathode metal contact layer;

a third metal contact layer 63 covering the 1st drift ring 31 among the N drift rings 30 and electrically connected to the 1st drift ring 31; and a fourth metal contact layer 64 covering at least part of a region of the Nth drift ring 3N among the N drift rings 30 and electrically connected to the Nth drift ring 3N.

Taking as an example that the second component in each of the drift rings includes three subcomponents connected in parallel, as further shown in FIG. 3, in an embodiment of the present disclosure, high-photosensitivity region of the silicon carbide detector is located in an upper-right corner. In the present embodiment, the first subregion includes a portion located on a left side of the 1st drift ring and a portion located on a lower side of the 1st drift ring, and the second subregion includes a portion located on a right side of the 1st drift ring and a portion located on an upper side of the 1st drift ring.

Specifically, in an embodiment of the present disclosure, as further shown in FIG. 3, the first component 301 includes a first branch 3011 and a second branch 3012, and the second component 302 is located between the first branch 3011 and the second branch 3012. In the present embodiment, the 1st drift ring 31 is the closed ring; one end of the 2nd drift ring is electrically connected to a preset position of the 1st drift ring 31, extends a certain distance along an extension direction of the preset position of the 1st drift ring 31 and then begins to spirally extend outward around the 1st drift ring 31 to a leading end of the first branch of the first component of a 3rd drift ring;

the leading end of the first branch of the 3rd drift ring spirally extends outward around the 1st drift ring to a trailing end of the first branch of the 3rd drift ring, the trailing end of the first branch of the 3rd drift ring is connected to a leading end of the second component of the 3rd drift ring, i.e., the trailing end of the first branch of the 3rd drift ring splits into three parallel subcomponents connected in parallel, which spirally extend outward around the 1st drift ring to a leading end of the second branch of the 3rd drift ring to converge at the leading end of the second branch of the 3rd drift ring, and the leading end of the second branch of the 3rd drift ring spirally extends outward around the 1st drift ring to a trailing end of the second branch of the 3rd drift ring;

a leading end of the first branch of the 4th drift ring is connected to the trailing end of the second branch of the 3rd drift ring, the leading end of the first branch of the 4th drift ring spirally extends outward around the 1st drift ring to a trailing end of the first branch of the 4th drift ring, the trailing end of the first branch of the 4th drift ring is connected to a leading end of the second component of the 4th drift ring, i.e., the trailing end of the first branch of the 4th drift ring splits into three parallel subcomponents connected in parallel, which spirally extend outward around the 1st drift ring to a leading end of the second branch of the 4th drift ring to converge at the leading end of the second branch of the 4th drift ring, and the leading end of the second branch of the 4th drift ring spirally extends outward around the 1st drift ring to a trailing end of the second branch of the 4th drift ring; and a leading end of the first branch of a 5th drift ring is connected to the trailing end of the second branch of the 4th drift ring, and so on, until a trailing end of the second branch of the Nth drift ring 3N is electrically connected to the fourth metal contact layer 64.

In the silicon carbide detector provided in the embodiment of the present disclosure, from the 3rd drift ring to the Nth drift ring, each drift ring, after completing one full spiral, splits into 3 subcomponents that continue to spirally extend outward around the 1st drift ring. When different voltage signals are applied to the third metal contact layer and the fourth metal contact layer, a voltage gradient is automatically formed, thereby facilitating the formation of a stable lateral drift electric field within the silicon carbide base layer.

Optionally, in an embodiment of the present disclosure, the metal contact layers each include a nickel electrode layer, a titanium electrode layer, an aluminum electrode layer and a gold electrode layer that are stacked and have a thickness ranging from 20 nm to 5000 nm; i.e., the first metal contact layer includes the nickel electrode layer, the titanium electrode layer, the aluminum electrode layer and the gold electrode layer that are stacked, and the thickness of the first metal contact layer ranges from 20 nm to 5000 nm; the second metal contact layer includes the nickel electrode layer, the titanium electrode layer, the aluminum electrode layer and the gold electrode layer that are stacked, and the thickness of the second metal contact layer ranges from 20 nm to 5000 nm; the third metal contact layer includes the nickel electrode layer, the titanium electrode layer, the aluminum electrode layer and the gold electrode layer that are stacked, and the thickness of the third metal contact layer ranges from 20 nm to 5000 nm; the fourth metal contact layer includes the nickel electrode layer, the titanium electrode layer, the aluminum electrode layer and the gold electrode layer that are stacked, and the thickness of the fourth metal contact layer ranges from 20 nm to 5000 nm; for example, the metal contact layer has a thickness of 300 nm. The present disclosure is not limited thereto and is subject to variations depending on specific circumstances.

In particular, in an embodiment of the present disclosure, an area of a projection of the silicon carbide base layer in a plane in which the silicon carbide substrate layer lies ranges from 0.01 mm² to 60 mm², for example, the area of the projection of the silicon carbide base layer on the plane in which the silicon carbide substrate layer lies is 4 mm². In particular, in an embodiment of the present disclosure, in a plane parallel to the plane in which the silicon carbide substrate layer lies, a radius of a circumscribed circle of an anode ranges from 20 μm to 500 μm, and a radius of a circumscribed circle of the fourth metal contact layer (i.e. the metal contact layer electrically connected to the Nth drift ring) ranges from 10 μm to 1000 μm. For example, in the plane parallel to the plane in which the silicon carbide substrate layer lies, the radius of the circumscribed circle of the anode is 80 μm, and the radius of the circumscribed circle of the fourth metal contact layer (i.e., the metal contact layer electrically connected to the Nth drift ring) is 90 μm. However, the present disclosure is not limited thereto and is subject to variations depending on specific circumstances.

Optionally, in an embodiment of the present disclosure, the silicon carbide detector further includes: a passivation layer covering regions of the anode layer and the second silicon carbide layer not covered by the metal contact layers. In some embodiments, the passivation layer is a silicon dioxide thin film, and a thickness of the passivation layer ranges from 100 nm to 10000 nm. For example, the thickness of the passivation layer is 1 μm. The present disclosure is not limited thereto and is subject to variations depending on specific circumstances.

Figure 4:
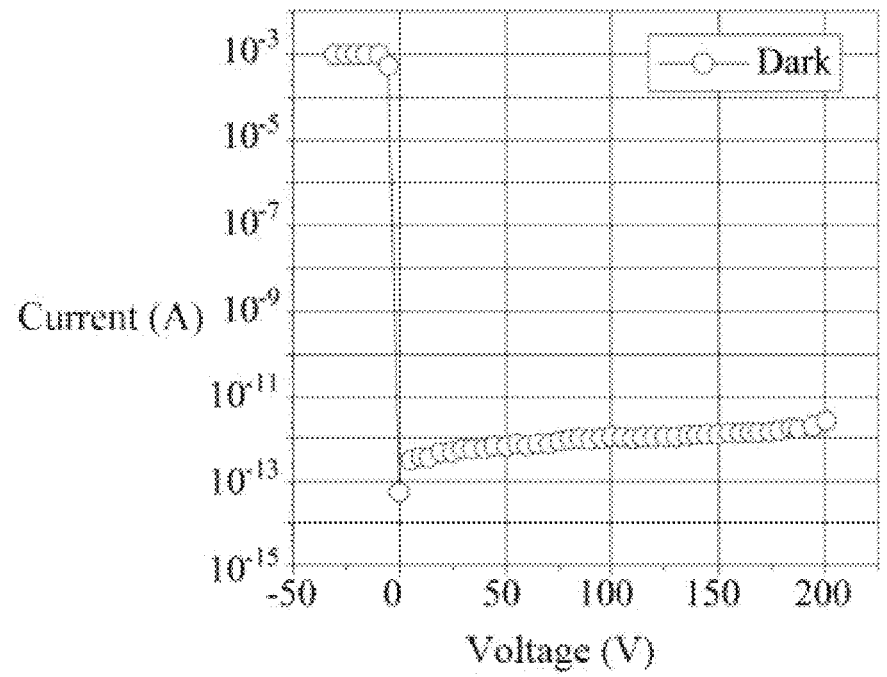
FIG. 4 shows a schematic view of an I-V characteristic curve of the silicon carbide detector provided in an embodiment of the present disclosure subjected to leakage current testing.

As shown in FIG. 4, FIG. 4 shows a schematic view of an I-V characteristic curve of the silicon carbide detector provided in an embodiment of the present disclosure subjected to leakage current testing, testing conditions including grounding a cathode of the silicon carbide detector and applying a bias voltage of –20 V to 180 V to an anode. A horizontal axis in FIG. 4 represents a value of a voltage applied to the anode, and a vertical axis represents a measured leakage current. As can be seen from FIG. 4, the leakage current of the silicon carbide detector varies slightly with an increase in the bias voltage applied to the anode, which is always smaller than a leakage current of a silicon drift detector by several orders of magnitude $10^{-9}$. Furthermore, when a bias voltage of 200 V is applied to the anode, the leakage current of the silicon carbide detector is extremely low, only 2.6 pA.

It can be seen that the silicon carbide detector provided in some embodiments of the present disclosure could have an ultra-low leakage current under non-refrigerated conditions.

In summary, the silicon carbide detector provided in some embodiments of the present disclosure could utilize the spiral arrangement of the remaining drift rings among the N drift rings, except for the 1st drift ring as the closed ring, to automatically form the uniform lateral voltage gradient. This ensures the uniform distribution of the electrons in the drift channel within the silicon carbide material, and the facilitates the formation of the stable lateral drift electric field within the silicon carbide base layer. Compared with the conventional silicon-based drift chamber detectors, the silicon carbide detector provided in some embodiments of the present disclosure could more easily result in the high-performance devices with extremely low leakage current, eliminating the need for the voltage divider, thereby significantly reducing the process complexity and the costs.

Figure 5:
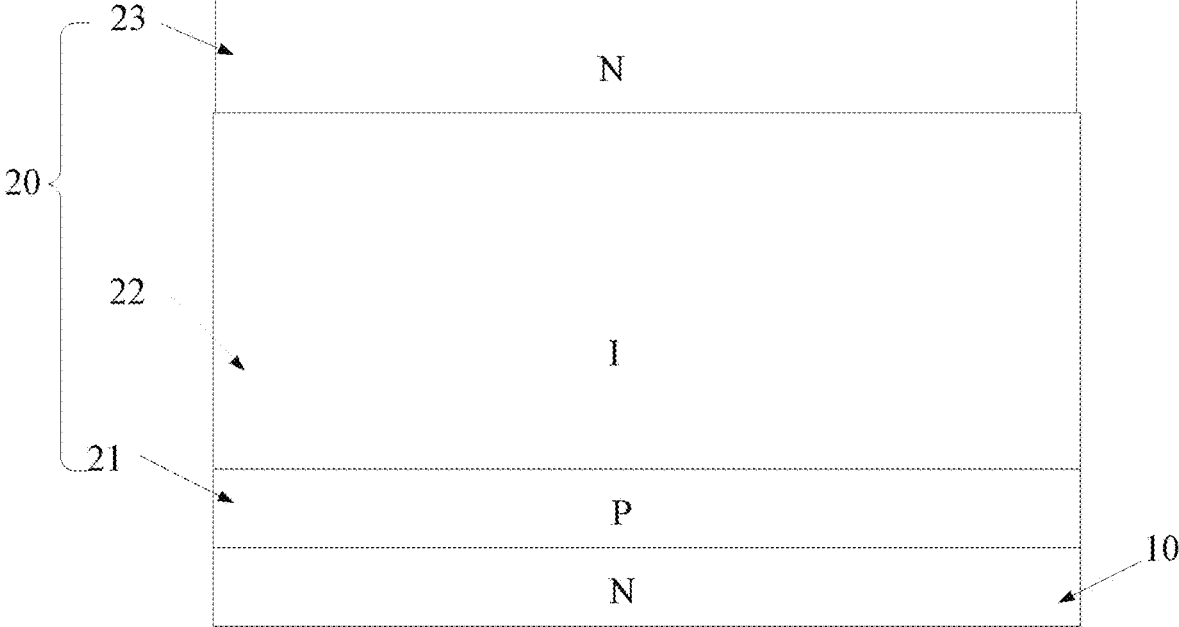
FIG. 5 to FIG. 10 show schematic views of part of the structures involved in the fabrication process of the silicon carbide detector provided in an embodiment of the present disclosure.

In addition, some embodiments of the present disclosure also provide a method for fabrication of a silicon carbide detector. The method for fabrication of the silicon carbide detector provided by some embodiments of the present disclosure includes:

S1: as shown in FIG. 5, forming a silicon carbide base layer 20 on a silicon carbide substrate layer 10, where the silicon carbide substrate layer 10 has a first doping type, the silicon carbide base layer 20 includes a first silicon carbide layer 21, a second silicon carbide layer 22 and a third silicon carbide layer 23 that are stacked, the first silicon carbide layer 21 having a second doping type, and the third silicon carbide layer 23 having the first doping type.

Since there is currently no P-type silicon carbide substrate due to process constraints, in an embodiment of the present disclosure, the first doping type is N-type, and the second doping type is P-type. That is, the silicon carbide substrate layer is an N-type silicon carbide substrate, and in the silicon carbide base layer, the first silicon carbide layer is a P-type silicon carbide layer, the third silicon carbide layer is an N-type silicon carbide layer, and the drift rings are P-type doped drift rings.

Taking the first doping type as the N-type and the second doping type as the P-type as an example, the silicon carbide detector provided in the embodiments of the present disclosure is described below.

Optionally, in an embodiment of the present disclosure, the first silicon carbide layer is a P-doped silicon carbide layer with a doping concentration ranging from $1\times10^{16}$ cm⁻³ to $1\times10^{19}$ cm⁻³ and a thickness ranging from 1 μm to 5 μm; the third silicon carbide layer is an N-type doped silicon carbide layer with a doping concentration ranging from $1\times10^{18}$ cm⁻³ to $3\times10^{20}$ cm⁻³ and a thickness ranging from 0.1 μm to 5 μm; and the second silicon carbide layer is an intrinsic layer or has a first doping type. When the second silicon carbide layer has the first doping type, a doping concentration of the second silicon carbide layer ranges from $1\times10^{12}$ cm⁻³ to $1\times10^{19}$ cm⁻³, and a thickness of the second silicon carbide layer ranges from 20 μm to 50 μm. However, the present disclosure is not limited thereto and is subject to variations depending on specific circumstances.

Figure 6:
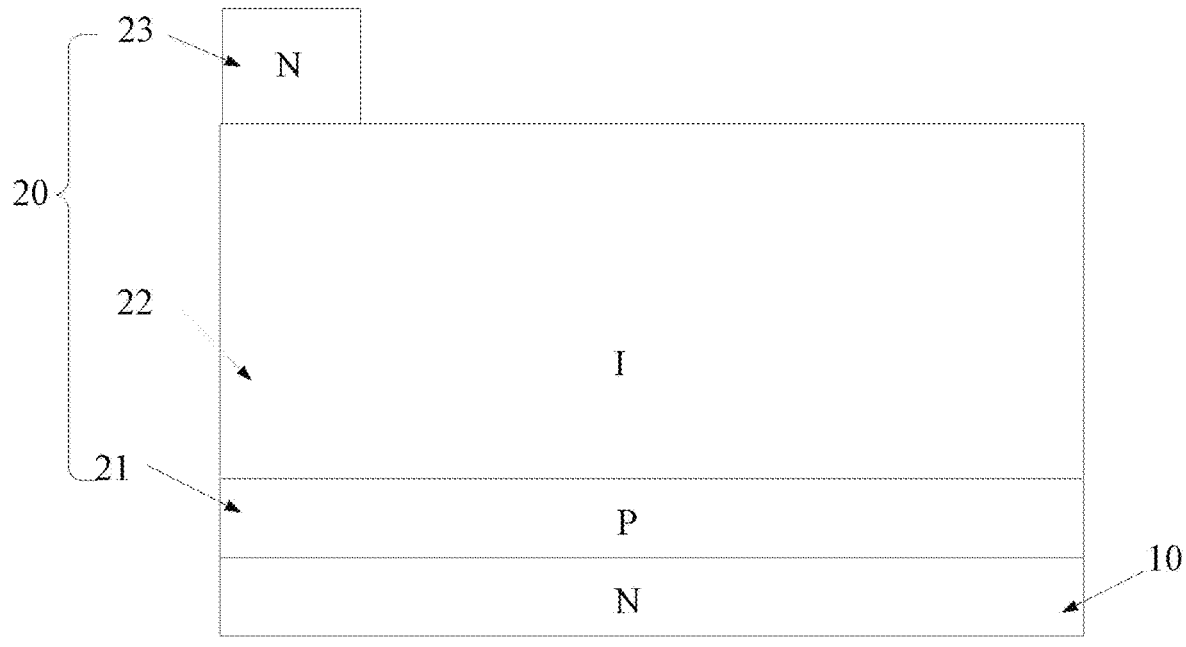

S2: as shown in FIG. 6, removing a portion of the third silicon carbide layer 23 located in a second region of the second silicon carbide layer 22 and retaining a portion of the third silicon carbide layer 23 located in a first region of the second silicon carbide layer 22 to form an anode layer.

Optionally, in an embodiment of the present disclosure, steps of the removing the portion of the third silicon carbide layer located in the second region of the second silicon carbide layer and retaining the portion of the third silicon carbide layer located in the first region of the second silicon carbide layer to form the anode layer include:

forming a second mask layer on a surface of the third silicon carbide layer on a side facing away from the second silicon carbide layer, where the second mask layer covers a region of the third silicon carbide layer where the anode layer is to be formed, and other regions of the third silicon carbide layer are exposed;

using the second mask layer as a mask, removing the portion of the third silicon carbide layer located in the second region of the second silicon carbide layer by means of an inductively coupled plasma etching process, and retaining the portion of the third silicon carbide layer located in the first region of the second silicon carbide layer to form the anode layer, where optionally, a projection of the anode layer on a plane in which the silicon carbide substrate layer lies is circular; and removing the second mask layer.

Specifically, in an embodiment of the present disclosure, the portion of the third silicon carbide layer located in the second region of the second silicon carbide layer is removed using an inductively coupled plasma etcher, the portion of the third silicon carbide layer located in the first region of the second silicon carbide layer is retained, and then the anode layer is formed.

Optionally, in an embodiment of the present disclosure, the second mask layer is a photolithographic pattern layer. However, the present disclosure is not limited thereto and is subject to variations depending on specific circumstances.

S3: performing ion implantation in the second region of the second silicon carbide layer to form N drift rings in the second region of the second silicon carbide layer, where among the N drift rings, a 1st drift ring is a closed ring and remaining drift rings are arranged in a spiral pattern around the 1st drift ring, a leading end of an (i+1)th drift ring being connected to a trailing end of an ith drift ring, N being an integer greater than 1, i being, in turn, any integer from 1 to N−1; in a plane parallel to a plane in which the silicon carbide substrate layer lies, the anode layer is located in a closed region of the 1st drift ring; and the second silicon carbide layer has the first doping type and the N drift rings each have the second doping type.

Figure 7:
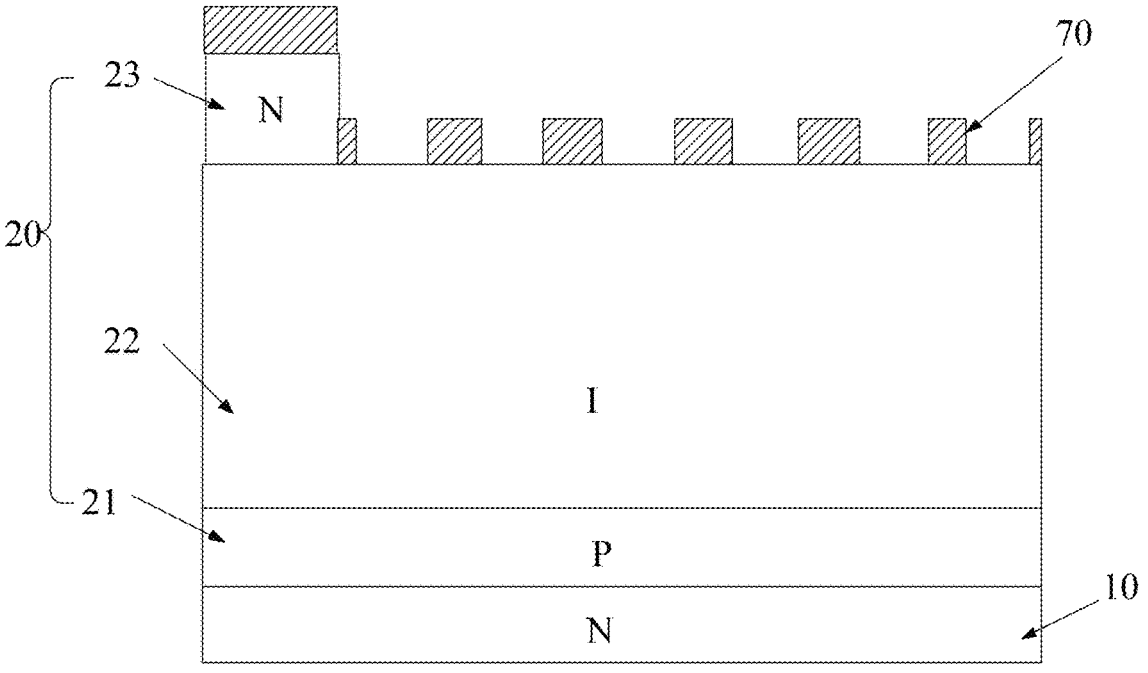
Figure 8:
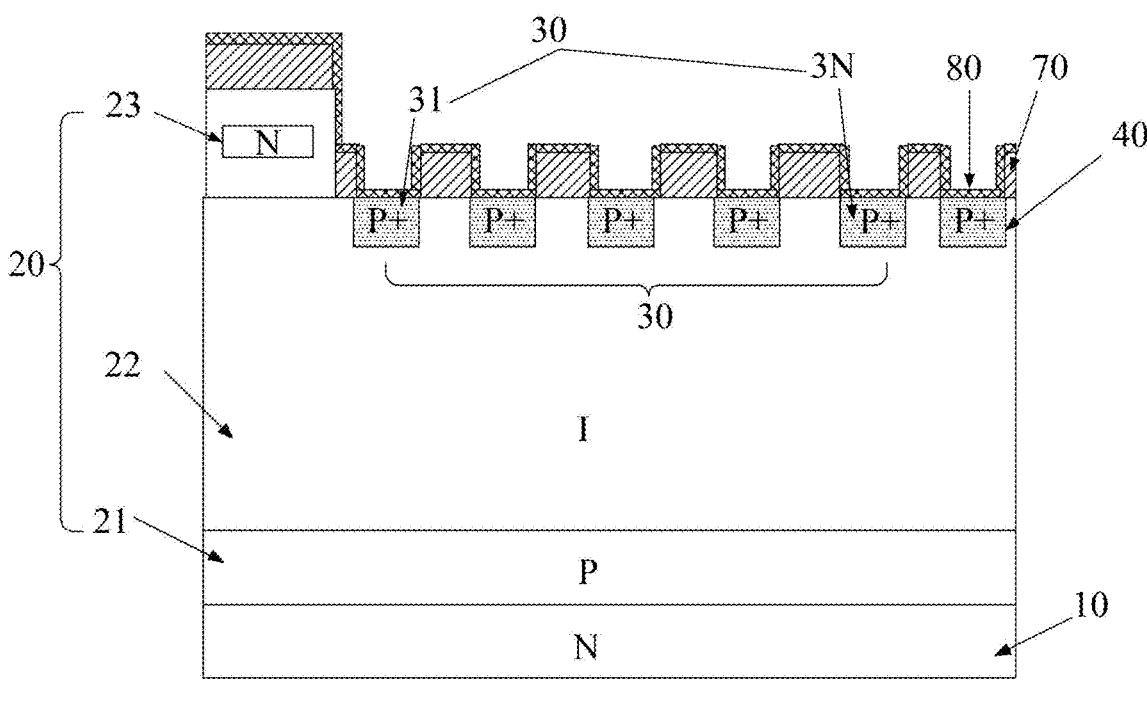
Figure 9:
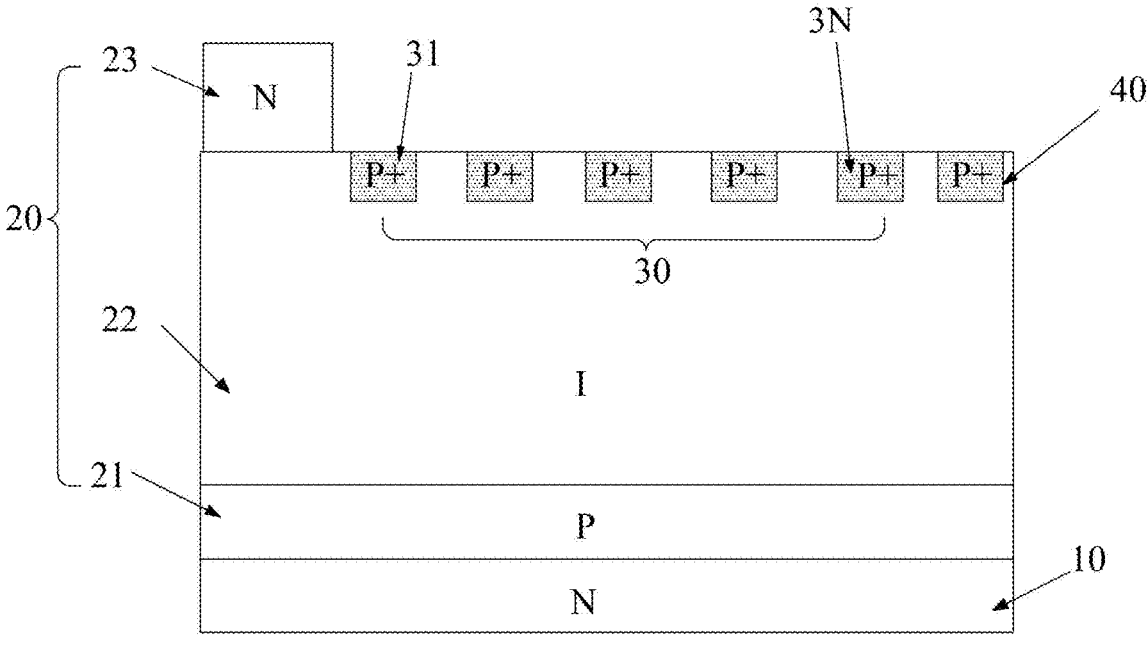

Optionally, in an embodiment of the present disclosure, steps of the performing the ion implantation in the second region of the second silicon carbide layer to form the N drift rings in the second region of the second silicon carbide layer include:

as shown in FIG. 7, forming a first mask layer 70 on a side of the silicon carbide base layer 20 facing away from the silicon carbide substrate layer 10, where the first mask layer 70 has a plurality of openings exposing regions of the second silicon carbide layer 22 where the N drift rings are to be formed;

as shown in FIG. 8, forming a protective layer 80 covering the silicon carbide base layer 20 and the first mask layer 70 on a side of the first mask layer 70 facing away from the silicon carbide base layer 20, where the protective layer 80 covers the plurality of the openings; as further shown in FIG. 8, performing the ion implantation in the second silicon carbide layer 22 using the first mask layer 70 as a mask to form the N drift rings 30 in the second region of the second silicon carbide layer 22; and as shown in FIG. 9, removing the first mask layer and the protective layer.

It should be noted that provision of the protective layer could prevent implantation damage from occurring on a surface of the second silicon carbide layer when the N drift rings are formed in the second region of the second silicon carbide layer by performing ion implantation into the second silicon carbide layer using the first mask layer as a mask, and additionally improves uniformity of implanted ions in regions of the drift rings near a surface of the second silicon carbide layer. Optionally, in an embodiment of the present disclosure, the protective layer is a silicon dioxide film, and a thickness of the protective layer ranges from 20 to 500 nm, for example, 100 nm. However, the present disclosure is not limited thereto and is subject to variations depending on specific circumstances.

Optionally, in an embodiment of the present disclosure, the first mask layer is a silicon dioxide layer or a silicon nitride layer. Specifically, in an embodiment of the present disclosure, the first mask layer is the silicon dioxide layer. Steps of forming the first mask layer on the side of the silicon carbide base layer facing away from the silicon carbide substrate layer, where the first mask layer has the plurality of the openings exposing the regions of the second silicon carbide layer where the N drift rings are to be formed, include:

fabricating a silicon dioxide thin film on a surface of the silicon carbide base layer by means of chemical vapor deposition at a high temperature of 350° C., where optionally, a thickness of the silicon dioxide thin film ranges from 0.5 μm, to 5 μm, and further optionally, the thickness of the silicon dioxide thin film is 1 μm, which is not limited in the present application and may vary depending on specific circumstances;

placing a third mask layer on a surface of the first mask layer, where the third mask layer has an opening, the opening of the third mask layer corresponds to a region of the second silicon carbide layer where a drift ring and/or a guard ring is to be formed, and optionally, the third mask layer is a photoresist pattern layer; and performing wet etching on the first mask layer using the third mask layer to form the plurality of the openings in the first mask layer which expose the regions of the second silicon carbide layer where the N drift rings are to be formed.

Optionally, in an embodiment of the present disclosure, steps of the performing the wet etching on the first mask layer using the third mask layer to form the plurality of the openings in the first mask layer include: soaking the first mask layer with a BOE solution for 5 minutes to 20 minutes, for example, 10 minutes, to form the plurality of the openings in the first mask layer. However, the present disclosure is not limited thereto and is subject to variations depending on specific circumstances.

Optionally, in an embodiment of the present disclosure, a size of each of the openings is in a range of 10 μm to 50 μm, to prevent the openings from being excessively wide, which could lead to overly broad conductive paths in subsequently formed drift rings and hinder carrier migration and also prevents the openings from being too narrow, which would increase process complexity and make implementation infeasible.

Optionally, in an embodiment of the present disclosure, steps of the performing the ion implantation in the second silicon carbide layer using the first mask layer as the mask to form the N drift rings in the second region of the second silicon carbide layer include: performing the ion implantation in the second silicon carbide layer by using the first mask layer as the mask and by means of a first implantation energy, a second implantation energy, and a third implantation energy to form the N drift rings in the second region of the second silicon carbide layer, where the first implantation energy is less than the second implantation energy, and the second implantation energy is less than the third implantation energy. Specifically, in an embodiment of the present disclosure, the first implantation energy is 50 kev, the second implantation energy is 100 kev, and the third implantation energy is 150 kev. However, the present disclosure is not limited thereto and is subject to variations depending on specific circumstances.

Optionally, in an embodiment of the present disclosure, steps of the removing the first mask layer and the protective layer include removing the first mask layer and the protective layer by means of a wet etching process, for example, removing the first mask layer and the protective layer by using a BOE solution as an etching solution for wet etching.

It should be noted that, in the present embodiment, as further shown in FIG. 8 and FIG. 9, when the silicon carbide detector includes guard rings 40, and the guard rings 40 and the drift rings 30 are formed simultaneously.

Based on any of the above embodiments, in an embodiment of the present disclosure, the method further include:

S4: performing an oxidation process on an exposed surface of the second silicon carbide layer on a side facing away from the silicon carbide substrate layer and on a surface of the anode layer on a side facing away from the silicon carbide substrate layer to form a first oxide layer, and removing the first oxide layer to repair etching damage on a surface of the second silicon carbide layer on a side facing away from the first silicon carbide layer.

S5: performing the oxidation process at least one time on the exposed surface of the second silicon carbide layer on the side facing away from the silicon carbide substrate layer and on the surface of the anode layer on the side facing away from the silicon carbide substrate layer to form a second oxide layer, and removing the second oxide layer, to treat dangling bonds on the surface of the second silicon carbide layer on the side facing away from the first silicon carbide layer, thereby obtaining a better surface quality.

Optionally, in an embodiment of the present disclosure, steps of the performing the oxidation process on the exposed surface of the second silicon carbide layer on the side facing away from the silicon carbide substrate layer and on the surface of the anode layer on the side facing away from the silicon carbide substrate layer to form the first oxide layer, and removing the first oxide layer include:

placing the silicon carbide detector into a thermal oxidation furnace, and performing wet-oxygen oxidation at 1050° C. for 1 hour to 3 hours, for example, 2 hours, to form the first oxide layer on the exposed surface of the second silicon carbide layer on the side facing away from the silicon carbide substrate layer and on the surface of the anode layer on the side facing away from the silicon carbide substrate layer; and placing the silicon carbide detector into a BOE solution for soaking for 5 minutes to 10 minutes, for example, 8 minutes, to remove the first oxide layer.

In some embodiments, in an embodiment of the present disclosure, steps of the performing at least one the oxidation process on the exposed surface of the second silicon carbide layer on the side facing away from the silicon carbide substrate layer and on the surface of the anode layer on the side facing away from the silicon carbide substrate layer to form the second oxide layer, and the removing the second oxide layer include:

placing the silicon carbide detector into the thermal oxidation furnace, performing dry-oxygen oxidation at 1050° C. for 0.5 hours to 3 hours, for example, 1.5 hours, performing wet-oxygen oxidation for 0.5 hours to 3 hours, for example, 1.5 hours, and then performing the dry-oxygen oxidation again for 0.5 hours to 3 hours, for example, 1.5 hours, to form the second oxide layer on the exposed surface of the second silicon carbide layer on the side facing away from the silicon carbide substrate layer and on the surface of the anode layer on the side facing away from the silicon carbide substrate layer; and placing the silicon carbide detector into a BOE solution for soaking to remove the second oxide layer.

Figure 10:
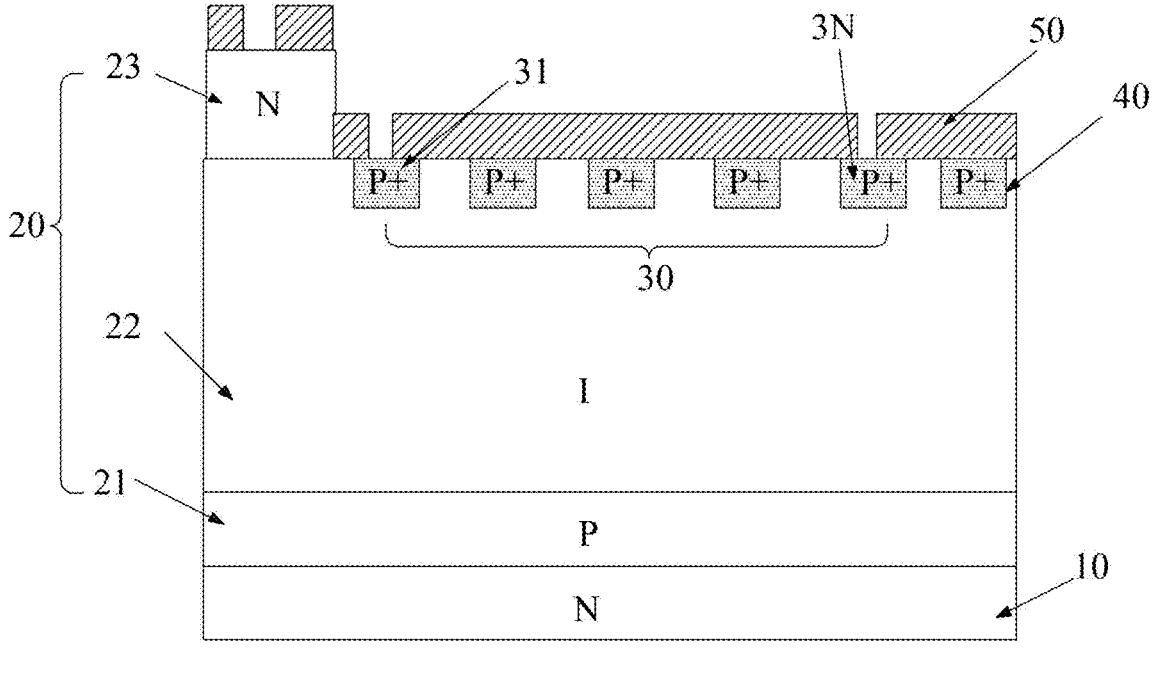

Based on any of the above embodiments, in an embodiment of the present disclosure, the method further includes:

S6: as shown in FIG. 10, forming a passivation layer 50 on the surface of the second silicon carbide layer 22 on the side facing away from the first silicon carbide layer 21, where the passivation layer 50 covers the second region of the second silicon carbide layer 22 except for regions where metal contact layers are to be formed.

S7: as further shown in FIG. 1, forming the metal contact layers on the surface of the second silicon carbide layer 22 on the side facing away from the first silicon carbide layer 21, where the metal contact layers include:

a first metal contact layer 61 covering the anode layer and electrically connected to the anode layer, the first metal contact layer 61 being an anode metal contact layer;

a third metal contact layer 63 covering the 1st drift ring 31 among the N drift rings and electrically connected to the 1st drift ring 31; and a fourth metal contact layer 64 covering at least part of a region of the Nth drift ring 3N among the N drift rings and electrically connected to the Nth drift ring 3N.

Optionally, in an embodiment of the present disclosure, steps of the forming the passivation layer on the surface of the second silicon carbide layer on the side facing away from the first silicon carbide layer, where the passivation layer covers the second region of the second silicon carbide layer except for the regions where the metal contact layers are to be formed, include:

fabricating the passivation layer on a surface of the silicon carbide base layer on the side facing away from the silicon carbide substrate layer by chemical vapor deposition at a high temperature of 350° C., where optionally, the passivation layer is a silicon dioxide thin film with a thickness ranging from 0.5 μm to 5 μm, for example, 1.5 μm;

annealing the passivation layer at 900° C. in a nitrogen atmosphere to densify the passivation layer and obtain a high-quality passivation layer;

forming a fourth mask layer on a side of the passivation layer facing away from the silicon carbide base layer, where the fourth mask layer has openings corresponding to regions where the metal contact layers are to be formed, and optionally, the fourth mask layer is a photoresist pattern layer;

etching the passivation layer by using the fourth mask layer as a mask, and removing portions of the passivation layer in regions corresponding to the surface of the second silicon carbide layer, where the metal contact layers are to be formed, by a wet etching process using an etching agent such as a BOE solution; and removing the fourth mask layer.

Optionally, in an embodiment of the present disclosure, steps of the forming the metal contact layers on the surface of the second silicon carbide layer on the side facing away from the first silicon carbide layer include: forming the metal contact layers on the surface of the second silicon carbide layer on the side facing away from the first silicon carbide layer by a physical vapor deposition process.

Based on any of the above embodiments, in an embodiment of the present disclosure, the method further includes: forming a second metal contact layer (i.e., a cathode metal contact layer) covering the silicon carbide substrate layer on a side of the silicon carbide substrate layer facing away from the silicon carbide base layer.

In summary, the silicon carbide detector and the fabrication method thereof provided in some embodiments of the present disclosure could utilize a spiral arrangement of remaining drift rings among the N drift rings, except for the 1st drift ring as the closed ring, to automatically form a uniform lateral voltage gradient. This ensures a uniform distribution of electrons in the drift channels within the silicon carbide material, and facilitates the formation of a stable lateral drift electric field within the base. As a result, a relatively uniform photocurrent value could be obtained in any photosensitive region, improving the detection performance of the detector.

Moreover, compared with conventional silicon-based drift chamber detectors, the silicon carbide detector provided in some embodiments of the present disclosure could more easily achieve a high-performance device with extremely low leakage current, eliminating the need for a voltage divider, and significantly reducing process complexity and costs.

In this specification, each embodiment is described in a progressive manner, in parallel, or in a combination of both. Each embodiment primarily highlights differences from other embodiments, while the identical or similar parts of the embodiments could be referenced accordingly. For apparatus disclosed in the embodiments, since they correspond to a method disclosed in some embodiments of the present disclosure, the descriptions are relatively simple, and relevant details could be referred to in a method section.

It is noted that in the description of the present disclosure, it is to be understood that the descriptions of the drawings and the embodiments are illustrative and not restrictive. Like reference signs throughout the embodiments of the specification identify like structures. Additionally, for ease of understanding and description, the drawings may exaggerate a thickness of certain layers, films, panels, regions, etc. It should also be noted that in this specification, relational terms such as "first", "second" and the like are only used to distinguish one entity or operation from another entity or operation, and do not necessarily require or imply any actual relationship or sequence between these entities or operations. Moreover, the terms "include/including", "comprise/comprising", or any other variations thereof are intended to encompass a non-exclusive inclusion, such that an article or a device including a series of elements not only includes those elements, but also includes other elements not expressly listed or elements inherent to such the article or the device. Without further limitations, an element defined by the phrase "including a . . . /comprising a . . . " does not exclude the existence of the same additional elements in the article or the device that includes the above-mentioned elements.

The foregoing descriptions of the disclosed embodiments enable persons skilled in the art to implement or use the present disclosure. Various modifications to the embodiments will be readily apparent to those skilled in the art, and the generic principles defined herein may be implemented in other embodiments without departing from the spirit or scope of the present disclosure. Therefore, the present disclosure will not be limited to the embodiments described herein but is in accordance with the widest scope consistent with the principles and novel features disclosed herein.

What is claimed is:

1. A silicon carbide detector, comprising:
a silicon carbide substrate layer having a first doping type; and
a silicon carbide base layer located on a side of the silicon carbide substrate layer, the silicon carbide base layer comprising a first silicon carbide layer, a second silicon carbide layer and a third silicon carbide layer that are stacked, the first silicon carbide layer having a second doping type, and the third silicon carbide layer having the first doping type;
wherein the third silicon carbide layer serves as an anode layer and is located on a first region of the second silicon carbide layer, and a second region of the second silicon carbide layer is exposed; N drift rings are provided in the second region of the second silicon carbide layer, and among the N drift rings, a 1st drift ring is a closed ring and remaining drift rings are arranged in a spiral pattern around the 1st drift ring, a leading end of an (i+1)th drift ring being connected to a trailing end of an ith drift ring, N being 2 and i being 1, or N being an integer greater than 2, and i being, in turn, any integer from 1 to N−1; and in a plane parallel to a plane where the silicon carbide substrate layer lies, the anode layer is located in a closed region of the 1st drift ring; and the N drift rings each have the second doping type.

2. The silicon carbide detector according to claim 1, wherein the second region comprises a first subregion and a second subregion, a detection photosensitivity of the second subregion being greater than a detection photosensitivity of the first subregion; among the N drift rings, except for the 1st drift ring, at least one of the remaining drift rings comprises a first component located in the first subregion and a second component located in the second subregion; and the second component comprises M subcomponents connected in parallel, the M subcomponents being parallel to each other, and M being an integer in a range of not less than 2.

3. The silicon carbide detector according to claim 2, wherein the M is in a range of 2 to 4.

4. The silicon carbide detector according to claim 2, wherein when the N is greater than 2, among the N drift rings, except for the 1st drift ring and a 2nd drift ring, each of other drift rings comprises the first component located in the first subregion and the second component located in the second subregion; and the second component comprises the M subcomponents connected in parallel.

5. The silicon carbide detector according to claim 4, wherein among the N drift rings, except for the 1st drift ring and the 2nd drift ring, the other drift rings comprise a first drift ring and a second drift ring, a distance from the first drift ring to the 1st drift ring being less than a distance from the second drift ring to the 1st drift ring, and a number of subcomponents contained in the second component of the first drift ring being less than a number of subcomponents contained in the second component of the second drift ring.

6. The silicon carbide detector according to claim 1, wherein the second region of the second silicon carbide layer are further provided with guard rings, the guard rings being closed rings, and the N drift rings being located within a closed region of the guard rings.

7. The silicon carbide detector according to claim 1, wherein the first doping type is N-type, the second doping type is N-type, and doping ions in each of the N drift rings are selected from the group consisting of aluminum ions and boron ions; and a doping concentration in the second silicon carbide layer ranges from $1\times10^{12}$ cm$^{-3}$ to $1\times10^{19}$ cm$^{-3}$.

8. The silicon carbide detector according to claim 1, wherein a width of a gap between adjacent drift rings in the N drift rings ranges from 5 μm to 500 μm.

* * * * *